United States Patent
Mirov et al.

[11] Patent Number: 5,982,797
[45] Date of Patent: Nov. 9, 1999

[54] ROOM TEMPERATURE STABLE COLOR CENTER LASER, LIF:$F_2$, MATERIAL, METHOD OF LASING**

[75] Inventors: Sergey Mirov; Alex Dergachev, both of Birmingham, Ala.

[73] Assignee: UAB Research Foundation, Birmingham, Ala.

[21] Appl. No.: 09/135,067

[22] Filed: Aug. 17, 1998

Related U.S. Application Data

[62] Division of application No. 08/826,924, Apr. 8, 1997, Pat. No. 5,796,762
[60] Provisional application No. 60/015,024, Apr. 8, 1996.

[51] Int. Cl.$^6$ .................................................. H01H 3/16
[52] U.S. Cl. ............................................................ 372/42
[58] Field of Search ............................................... 372/42

[56] References Cited

U.S. PATENT DOCUMENTS

| | | | |
|---|---|---|---|
| 4,644,550 | 2/1987 | Csery et al. | 372/40 |
| 4,672,619 | 6/1987 | Luty et al. | 372/42 |
| 4,881,234 | 11/1989 | Foster et al. | 372/42 |
| 4,990,322 | 2/1991 | Pollock et al. | 372/42 |
| 5,267,254 | 11/1993 | Schneider et al. | 372/42 |
| 5,471,493 | 11/1995 | Mirov | 372/42 |
| 5,796,762 | 2/1998 | Mirov et al. | 372/42 |

FOREIGN PATENT DOCUMENTS 770419   5/1979   U.S.S.R. .

OTHER PUBLICATIONS

M.A. Aegerter and F. Luty, The $F^+_2$ Center in KCl Crystals. Part II: Optical Properties and Analogy with the $H^{+2}$ Molecule, Phys. Stat. Sol. (b), 43, 245–261 (1971).

M.A. Aegerter and F. Luty, The $F^+_2$ Center in KCl Crystals. Part I: Formation and Bleaching Kinetics, Phys. Stat. Sol.(b), 43, 227–243 (1971).

I.A. Parfianovich, V.M. Hulugurov, B.D. Lobanov, and N.T. Maximova, Luminescence and stimulated emission of color centers in LiF, Bull. Acad. Sci. USSR, Phys. Ser., 43, 20–27 (1979).

J. Nahum, Optical Properties and Mechanism of Formation of Some F–Aggregate Centers in LiF, Phys. Rev., 158, 814–825 (1967).

L. Bossi, C. Bussolati and G. Spinolo, Lifetime of the first excited state of the $F^+_2$ center in LiF, Phys. Lett., 32A, 159–160 (1970).

W. Gellermann, K.P. Koch and F. Luty, Recent progress in color center lasers, Laser Focus, 71–75 (Apr. 1982).

(List continued on next page.)

*Primary Examiner*—Leon Scott, Jr.
*Attorney, Agent, or Firm*—Gifford, Krass, Groh, Sprinkle, Anderson & Citkowski, P.C.

[57] ABSTRACT

The present invention is directed to a tunable, solid state laser utilizing room temperature, stable, color centers of LiF:$F_2^{+}$ material. Also disclosed is a method of lasing. An object of the present invention is to develop and optimize LiF:$F_2^{+}$ thermostabilized active media, to propose a method of pumping, and to realize a room temperature, stable and efficient operation of the color center laser. These and other objects are achieved by introducing special dopants in the crystal at the stage of crystal growing; applying special regimes of ionizing treatment of the crystal, resulting in thermostabilization of the $F_2^+$ centers in LiF crystals; and utilizing alexandrite laser radiation for color center crystal pumping with a pump radiation frequency which is appropriate for the selective excitation of the $F_2^+$ color centers. The invention can be used in cases when monochromatic laser emission tunable in the visible-infrared spectral region is required for solving problems in various fields of science and technology such as laser spectroscopy, photochemistry, photobiology, medicine, and the like.

3 Claims, 3 Drawing Sheets

OTHER PUBLICATIONS

L.F. Mollenauer, Dyelike lasers for the 0.9–2–$\mu$m region using $F^+_2$ centers in alkali halides, Opt. Lett., 1, 164–165 (1977).

L.F. Mollenauer, D.M. Bloom and A.M. DelGaudio, Broadly tunable cw lasers using $F^+_2$ centers for the 1.26–1.48 and 0.82–1.07 $\mu$m bands, Opt. Lett., 3, 48–50 (1978).

L.F. Mollenauer, Progress in color center lasers, J. Opt. Soc. Amer., 70, 634–645 (1980).

Yu.L. Gusev, S.I. Marennikov and V.P. Chebotaev, Lasing effect in the spectrum region of 0.88–1.2 $\mu$m using $F^+_2$ and $F^-_2$ color centers in LiF, Sov. Tech. Phys. Lett., 3, 124 (1977).

I.A. Parfianovich, F.M. Hulugurov, N.A. Ivanov, A.A. Mikhailenko, V.A. Chepurnoi and A.P. Shkadarevich, Doped LiF crystals—new active media for tunable lasers, in Proc. 4 All–Union Conf. Tunable Lasers, Novosibirsk, USSR, Dec. 1983, pp. 98–103, V.P. Chebotaev Ed.

V.M. Hulugurov and B.D. Lobanov, Laser action in the spectral region of 0.84–1.13 $\mu$m in the color center LiF–OH crystal at 300°K, Sov. Tech. Phys. Lett., 4, 595–596 (1978).

T.T. Basiev, S.B. Mirov and A.M. Prokhorov, Periodic pulsed tunable laser using an LiF crystal with $F^+_2$ –centers, excited by second–harmonic radiation from an $Nd^{3+}$–garnet laser, Sov. J. Dokl. Acad. Nauk SSSR, 246, 72–74 (1979).

T.T. Basiev, S.B. Mirov, Room Temperature Tunable Color Center Laser, Laser Science and Technology books series. An International Handbook, vol. 16 pp. 1–160. Gordon and Breach Science Publishers/Harwood Academic Publishers (1994).

T.T. Basiev, S.B. Mirov, Room Temperature Tunable Color Center Laser, Laser Science and Technology books series. An International Handbook, vol. 16 pp. 1–160. Gordon and Breach Science Publishers/Harwood Academic Publishers (1994).

L.F. Mollenauer and J.C. White (Eds.), Tunable Lasers, pp. 1–277. New York: Springer Verlag (1987).

D. Wandt, W. Gellerman, F. Luty and H. Welling, Tunable cw laser operation in the 1.45–2.16 $\mu$m range based on $F^+_2$–like centers in $O^+_2$ doped NaCl, KCl, and KBr crystals, J. App. Phys., 61, 864 (1987).

T.T. Basiev, S.B. Mirov and V.V. Osiko, Room–Temperature Color Center Lasers, IEEE J. of QE 24, 1052 (1988).

A.A. Alybakov, Yu.L. Gusev, O.V. Drozdova, A.V. Kirpichnikov, S.S. Kolyago and B.S. Umurzakov, The properties of active media based on ($F^+_2)_A$ and $F_3$+color centers in NaF crystals, in Proc. 4 All–Union Conf. Tunable Lasers, Novosibirsk, USSR, Dec. 1983, pp. 124–129, V.P. Chebotaev, Ed. Place: Inst. Thermo–Phys. USSR Acad. Sci. (1984).

T.T. Basiev, V.A. Konyushkin, S.B. Mirov, V.V. Ter–Mikirtychev, Efficient Tunable Lasers Utilizing $F_2$ and $F^+_2$ Color Centers in LiF($F_2$) Crystals, Sov. J. Quant. Electron., 19, 145 (1992).

Ch.B. Lushchik, I.K. Vitol and M.A. Élango, Decay of electronic excitations into radiation defects in ionic crystals, Uspehi Fizicheskih Nauk, 122, 223–252 (1977); Sov. Achievements Physi. Sci. (1977).

C.J. Delbecq, A Study of M Center Formation in Additively Colored KCl, Z. Phys., vol. 171, N3, pp. 60–581 (1963).

ROOM TEMPERATURE STABLE COLOR CENTER LASER, LIF:F$_2^+$ ** MATERIAL, METHOD OF LASING

RELATED APPLICATION

This application is a divisional of U.S. application Ser. No. 08/826,924 filed on Apr. 8, 1997 U.S. Pat. No. 5,796,762, which claims priority of provisional patent application Serial No. 60/015,024, filed Apr. 8, 1996, and are hereby incorporated by reference.

BACKGROUND OF THE INVENTION

I. Field of the Invention

The present invention relates to the field of Quantum Electronics, and more particularly to the element basis of laser technology, and can be used for developing tunable solid state lasers.

Primarily, the invention can be used in cases when monochromatic laser emission tunable in the visible-infrared spectral region is required for solving problems in various fields of science and technology, such as laser spectroscopy, photo chemistry, photo biology, medicine, and the like.

II. Description of the Prior Art

F$_2^+$ color centers (CCs) in alkali-halide crystals constitute a pair of neighboring anion vacancies (located along the [110] axis), with one captured electron. The fact that the anion vacancies are equivalent was used to compare the energy levels of the F$_2^+$ centers with those of the hydrogen molecular ion, H$_2^+$. Such an approach, though not very accurate, provides a satisfactory consistency for the energies of transitions. At a distance R between the anion vacancies in a medium with dielectric constant E, the values of the F$_2$+transition energies can be obtained from the equation $$E_{F_2^+} = \epsilon^{-2} \cdot E_{H_2^+}(R/\epsilon), \quad (1)$$

where the values $\epsilon$ and R are fitted to attain better agreement with experimental results.

The F$_2^+$ CC energy level diagram is presented in M. A. Aegerter and F. Luty, The F$_2^+$ center in KCL crystal. Part 1. Formation and bleaching kinetics, Phys. Stat. Sol. (b), 43, 227–243 (1971), which is herein incorporated by reference.

The levels are marked analogously with those of the H$_2^+$ molecular ion. The low-lying optical transition is the transition $1s\sigma_g \to 2p\sigma_u$. The two higher-energy transitions, $1s\sigma_g \to 2p\pi_u$, are in the region of the F absorption band. It should be noted that the quantum yield of the radiational transition from the upper $2p\sigma_u$ level, presented in the diagram, decreases practically to zero with increasing temperature up to 100 K. At temperatures above 100 K, only emission from the lower excited $2p\sigma_u$ level can be observed. The quantum yield of this F$_2^+$ emission, which is observed for all alkali-halide crystals is rather high. For instance, according to I. A. Parfianovich, V. M. Hulugurov, B. D. Lobanov, and N. T. Maximova, Luminescence and stimulated emission of color centers in LiF, Bull. Acad. Sci. USSR, Phys. Ser., 43, 20–27 (1979), which is incorporated herein by reference, for LiF:F$_2^+$ $\eta$=0.52 at T=90 K, and $\eta$=0.15 at T=300 K.

Some spectroscopic data for pure F$_2^+$ CCs in LiF are presented below. This medium is one of the most promising among CC crystals for producing laser operation at room temperature. The first most comprehensive studies of the F$_2^+$CCs optical properties were performed by J. Nahum, Optical properties and mechanism of formation of some F-aggregate centers in LiF, Phys. Rev., 158, 814–825 (1967), which is incorporated herein by reference. A relative oscillator strength of the optical transition $1s\sigma_g \to 2p\sigma_u$ at $\lambda_{max}$=645 nm was determined experimentally to be: $f_{F_2}/f_{F2^+}$=1.1. The temperature dependence of the absorption band half-width was determined by the excitation spectrum to correspond satisfactory to formula (2)

$$\Delta v(T) = \sqrt{8 \cdot \ln 2 \cdot S_0} \cdot \hbar\omega_o \sqrt{cth(\hbar\omega_o/2kT)} = \Delta v(0)\sqrt{cth(\hbar\omega_o/2kT)}, \quad (2)$$

with parameters $\Delta\upsilon(0)$=2450 cm$^{-1}$, $\omega_o$=2$\pi$·6.8·10$^{12}$s$^{-1}$, S$_o$=21.1, where $\Delta\upsilon(0)$ is the multiphonon band half-width at 0 K, $\omega_o$ is the effective phonon frequency, and S$_o$ is the effective Huang-Rhys factor.

The luminescence band with $\lambda_{max}$=910 nm and half-width 1730 cm$^{-1}$ corresponds to the radiational transition $2p\sigma_u \to 1s\sigma_g$ of the F$_2^+$CCs in LiF at 77 K. The temperature dependence of the luminescence band half-width is determined by formula (2) with parameters $\Delta\upsilon(0)$=1720 cm$^{-1}$, $\omega_o$=2$\pi$·7.4·10$^{12}$s$^{-1}$, S$_o$=8.74. The F$_2^+$ luminescence band shape in LiF is well described by the Gaussian curve. The measured lifetime of the relaxed excited at 77 K state equals 29 ns.

The ionic configurations of the F$_2^+$ and F$_A$(II) CCs are identical in a relaxed excited state. This enabled F. Luty, who studied their properties comprehensively, to suggest to the Bell Telephone group in 1974, their use as a laser active center. W. Gellermann, K. P. Koch and F. Luty, Recent progress in color center lasers, Laser Focus, 71–75 (April 1982), incorporated herein by reference. Lasing on F$_2^+$CCs at liquid nitrogen temperature was done for the first time by Mollenauer. L. F. Mollenauer, Dye like lasers for the 0.9–2 $\mu$m region using F$_2^+$ centers in alkali-halides, Opt. Lett., 1, 164–154 (1977); L. F. Mollenauer, D. M. Bloom and A. M. DelGaudio, Broadly tunable cw lasers using F$_2^+$ for the 1.26–1.48 and 0.82–1.07 $\mu$m bands, Opt. Lett., 3, 48–50 (1978), incorporated herein by reference. Later on, it was this medium that enabled state-of-the-art efficiencies (60%) and average power of continuous lasing (up to 1.8 W). However, the problem of fast degradation of the laser output power has prevented the production of the laser commercially. Therefore, it has been available only for highly specialized experts.

Room temperature lasing of F$_2^+$CCs in LiF crystal was attained for the first time by Gusev et al. under ruby laser pumping. Yu. L. Gusev, S. I. Marennikov, and V. P. Chebotaev, Lasing effect in the spectrum region of 0.88–1.2 $\mu$m using F$_2^+$ and F$_2^-$ color centers in LiF, Sov. Tech. Phys. Lett., 3, 124 (1977), incorporated herein by reference. The efficiency of the laser was not high (2–6%), and the thermal degradation of F$_2^+$ CCs at 300 K with a half decay time of 12 h prevented the crystal from being used for more than 24 h.

A group at Irkutsk State University, Russia doped the original crystals with impurities to stabilize F$_2^+$CCs. The LiF crystals doped with hydroxyl ions enabled the formation of F$_2^+$(OH) CCs that are thermostable up to a temperature of 380 K. However, besides the thermostabilizing effect of the hydroxyl ions, some decline of the laser output characteristics was observed.

LiF:F$_2^+$ crystals have significant advantages as efficient active media for lasers tunable in the 820–1150 nm spectral region. The high quantum efficiency to temperatures above room temperature, the considerable values of absorption and emission cross-sections, and the frequency tuning region exceeding those for the majority of known laser media have roused great interest in this medium. Unfortunately, low thermal stability of $F_2^+$ centers (half decay time at 300 K is about 12 hours) previously prevented wide use of LiF:$F_2^+$ lasers.

To solve the problem of LiF:$F_2^+$ active media stability a new technique for two-step photoionization of neutral $F_2$ centers in LiF was proposed. Utilization of the proposed method of $F_2 \rightarrow F_2^+$ transformation by the focused pump radiation resulted in an efficient (up to 40%) lasing of unperturbed $F_2^+$ centers. However, the problem of the active element operational stability has not been solved completely. Each active zone of the crystal pumped by the focused radiation of 532 nm experienced exhausting due to thermal degradation of $F_2^+$ centers. Thus crystals could be used for $10^2$–$10^3$ multi-hour cycles before they have to be replaced.

The thermal stability of positively charged $F_2^+$ centers can be raised by applying suitable anion or cation impurity doping during crystal growth. In this case new $F_2^+$ like optical centers are formed, which are perturbed by dopant ions or by components of dopant destruction. For example: the $F_2^{+*}$–$F_2^+$ center, perturbed by Me$^{++}$ ions in LiF & NaF crystals; the $F_2^{+**}$–$F_2^+$ center, perturbed by O$^-$ ions in LiF, NaF, NaCl, KCl, KBr crystals; and the $(F_2^+)_A$–$F_2^+$ center, perturbed by Li in NaF and KCl crystals.

However, this idea for room temperature thermostabilization of $F_2^+$ like centers does not always provide appropriate photostability of active medium under powerful laser excitation. For example, pumping of the LiF:$F_2^{+**}$ stabilized crystals by the radiation of the second harmonic of YAG:Nd laser results in a significant fading of the color center laser output. This fading is caused by the complex photo-chemical process in the pumping channel of the crystal, which involves two-step photoionization of neutral $F_2$ centers and trapping of the released electron by the positively charged $F_2^+$ centers.

In the proposed invention the problems related to photo and thermostability of LiF:$F_2^+$ crystals are solved simultaneously and an efficient room temperature stable lasing of color centers is realized.

SUMMARY OF THE PRESENT INVENTION

The object of the present invention is to develop and optimize LiF:$F_2^+$ thermostabilized active media, to propose a method of pumping, and to realize a room temperature stable and efficient operation of the color center laser.

These and other objects are achieved by:
introducing special dopants in the crystal at the stage of crystal growing;
application of special regimes of ionizing treatment of the crystal, resulting in thermostabilization of the $F_2^+$ centers in LiF crystals; and
utilization of alexandrite laser radiation for color center crystal pumping with a frequency of the pump radiation satisfying two general conditions: it is lower than the threshold frequency of the neutral $F_2$ centers photoionization and still overlaps with the positively charged $F_2^+$ like centers absorption band and, hence, is still appropriate for their selective excitation.

The above-mentioned objects and features of the present invention will become apparent from the following description.

BRIEF DESCRIPTION OF THE DRAWINGS

The herein described advantages and features of the present invention, as well as others which will become apparent, are attained and can be understood in more detail by reference to the following description and appended drawings, which form a part of this specification.

It is to be noted, however, that the appended drawings illustrate only exemplary embodiments of the invention and are therefore not to be considered limiting of its scope, for the invention may admit to other equally effective embodiments.

DETAILED DESCRIPTION OF THE PREFERRED EMBODIMENTS OF THE PRESENT INVENTION a) Preparation of Crystals FIG. 1 is a flow chart for an embodiment of a method 100 for producing LiF:$F_2^{+**}$ active media according to the present invention. In procedural step 102, a LiF crystal is grown. The crystals of the present invention can be grown by any method which assures good optical quality. A preferred embodiment for crystal growth is the Kyropulos method in which the crystal is grown from a seed inserted into alkali halide liquid near its melt temperature. In our particular case the crystals were grown by the Kyropulos method in platinum crucibles under argon atmosphere from nominally pure raw materials, doped with LiOH (up to 1 mole %), Li$_2$O (up to 0.5 mole %) and MgF$_2$ (up to 0.5 mole %).

Figure 1:
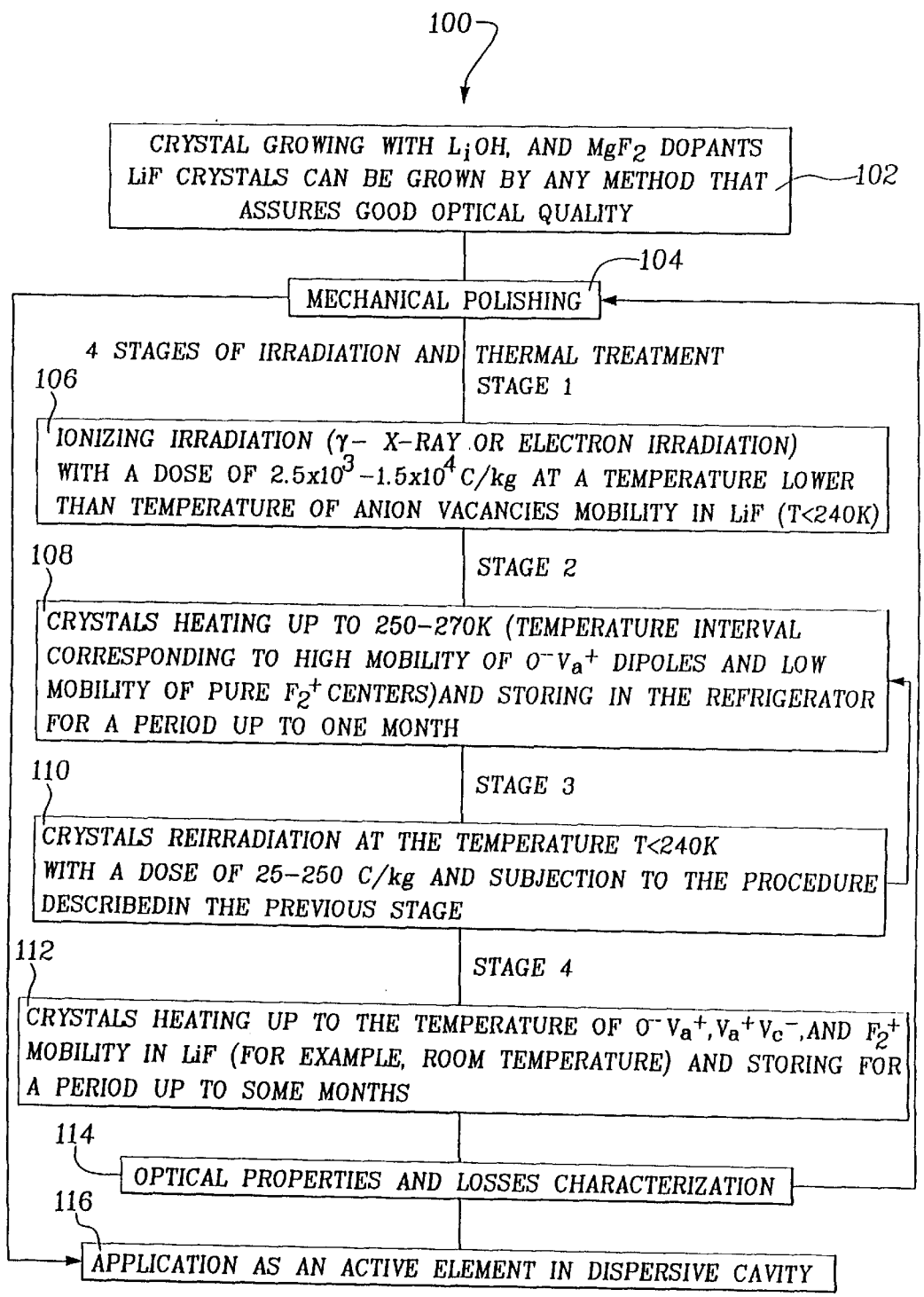
FIG. 1 is a flow chart of an embodiment of a method for producing LiF:$F_2^{+**}$ active medium according to the present invention.

Infrared measurements of the absorption bands of the grown LiF crystals showed an intense band ($\upsilon_m$=3730 cm$^{-1}$, coefficient of absorption of about 0.5–2 cm$^{-1}$, depending on the LiOH concentration) of valent vibrations of OH$^-$ ions, substituting fluoride in the anion node of the crystalline lattice, and intense bands with frequency maxima at 3560 and 3610 cm$^{-1}$, corresponding to complexes Mg$^{++}$OH$^-$ OH$^-$V$_c^-$. UV absorption spectra of the grown LiF crystals exhibit some strong absorption bands in the region 200–270 nm that are due to the O$^{2-}$—V$_a^+$ as well as O$^{2-}$–Mg$^{2+}$ dipoles.

In order to obtain active crystals with a high concentration of $F_2^+$ stabilized centers with a small concentration of colloids and parasitic aggregate color centers the crystals grown in procedural step 102 are first mechanically polished in procedural step 104, and subjected to a special multistep irradiation treatment in procedural steps 106, 108, 110, and 112.

At the first stage of ionizing treatment in the procedural step 106 the crystals are subjected to γ-irradiation, X-ray or electron irradiation with a dose of 2.5×10$^3$–1.5×10$^4$ C/kg at a temperature T<240 K. The temperature T=240 K characterizes the beginning of anion vacancies (V$_a^+$) mobility in LiF crystals.

In the procedural step 108 the crystals are heated up to temperature corresponding to high mobility of O$^-$—V$_a^+$ dipoles and low mobility of pure $F_2^+$ centers (T=250–270 K) and stored in the refrigerator for a period up to one month.

In the procedural step 110 the crystals may be reirradiated at the temperature lower than temperature of anion vacancies mobility in LiF (T<240 K) with a dose of 25–250 C/kg and then subjected to the procedure described in the procedural step 108.

In the procedural step 112 the crystals are heated up to the temperature of $O^{--}V_a^+$, $V_a^+V_c^-$, and $F_2^+$ mobility in LiF (for example, room temperature) and are stored for a period up to some months, after which the crystals exhibit a stable concentration of the color centers of interest and are ready for utilization as active medium for tunable lasers.

After a polished crystal is produced in procedural steps 102–112 a characterization of the optical properties and losses of the crystal is conducted in the procedural step 114. This characterization is conducted to determine value of active absorption and losses in the resulting crystal. Once procedural step 114 determines real coefficients of active absorption and passive losses the crystal may be in the procedural step 104 mechanically processed and polished again up to the dimensions optimal for particular output parameters of the tunable laser, and then the crystal may be used in an application as an active element in the dispersive cavity of a device, which is represented by procedural step 116.

The following considers the processes taking place in the crystal and analyzes why the proposed technological sequence of the crystal preparation should provide advantageous distribution of color centers in LiF crystals.

The formation of aggregate color centers in alkali-halide crystals under ionizing radiation is a complicated process. It involves emergence, separation, and recombination of primary Frenkel defects, association into aggregate $F_2$, $(F_2)_A$, $F_2^+$, $(F_2^+)_A$, $F_2^-$, $F_3$, $F_3^+$, $F_3^-$ and other color centers and recharging of color centers by electrons and band holes. The defect formation may run fast or slow. Decomposition of self-localized excitons into primary radiational defects and recharging of color centers are relatively fast processes ($10^{-12}$–$10^{-7}$s). Slow processes run either due to spatial diffusion of the defects and their associates, or due to diffusion of self-localized holes (resulting in color centers recharging).

The efficiency of formation of any type of color centers is determined by all the above processes. These processes depend upon the temperature of irradiation and storage of the crystal, impurity composition of the initial material, ionizing radiation dose power and irradiation dose.

Separated electrons and holes, free and self-localized excitons are generated in alkali-halide crystals under ionizing irradiation. Self-localized excitons decompose with the emergence of F, H pairs. A fast recharging of these pairs under flux of electrons gives rise to actually simultaneous formation of the anion vacancies $V_a^+$ and interstitial halogen ions $I_a^-$.

$$e_s^o \Longrightarrow F+H, \tag{1}$$

$$e_s^o \Longrightarrow V_a^+ + I_a^-. \tag{2}$$

The mechanisms of formation of aggregate centers through migration of anion vacancies has been studied. Charged $F_2^+$ centers first appear, and then capture electrons to produce neutral $F_2$ centers:

$$V_a^+ + F \Longrightarrow F_2^+, \tag{3}$$

$$F_2^+ + e \Longrightarrow F_2. \tag{4}$$

Simultaneously with a fast process of electron capture, $F_2^+$ centers may take part in a slow temperature-dependent migration process. Colliding with the F, $F_2^+$ and $F_2^-$CCs, they form more complex CCs-$F_3^+$, $F_4^+$, and $F_4$, respectively:

$$F_2^+ + F \Longrightarrow F_3^+, \tag{5}$$

$$F_2^+ + F_2 \Longrightarrow F_4^+, \tag{6}$$

$$F_2^+ + F_2^- \Longrightarrow F_4, \tag{7}$$

whose further aggregation leads to the appearance of colloid particles in the crystal. The processes of $F_2$ CCs formation by scheme (4) are competing with the processes of their ionization due to a fast capture of free electrons $$F_2 + e \Longrightarrow F_2^-, \tag{8}$$

or holes $$F_2 + h \Longrightarrow F_2^+, \tag{9}$$

or due to diffusion processes involving mobile anion vacancies $$V_a^+ + F_2 \Longrightarrow F_3^+, \tag{10}$$

and self-localized holes $$F_2 + V_k \Longrightarrow F_2^+. \tag{11}$$

The processes of the type 4, 8, 9, 1 1, leading to recharging in the group of $F_2$, $F_2^+$, and $F_2^-$CCs, are also inherent in the group of $F_3$, $F_3^+$, and $F_3^-$CCs.

The ratio of the contributions of different reactions depends on the irradiation procedure and impurity composition in the irradiated crystal. Below, the irradiation treatment optimization for $F_2^+$ stabilized color center formation of the doped LiF crystals is presented.

1st stage

The processes that take place in the crystal under ionizing treatment at temperatures lower than 240 K are as follows.

Ionizing treatment creates a great number of divided electron and holes, which after thermalization can form self localized excitons. This excitons localized near a specific anion node of the crystalline lattice may annihilate and the released energy will be used for shifting anion from its node to the interstitial position with an anion vacancy and F center formation according to the schemes (1) and (2).

Simultaneously with primary defect formation according to (1) and (2) there takes place two processes of (OH)$^-$ ions dissociation under ionizing treatment $$2(OH^-) \Longrightarrow O_2^- + e + V_a^+ + 2H_i^o, \tag{12}$$

and $$2(OH^-) + V_a^+ + e \Longrightarrow O^{--}V_a^+ + O^- + 2H_i^o, \tag{13}$$

where "$O_2^-$" is a molecular ion of oxygen, "$O^-$" is a single ionized atom of oxygen, and "$H_i^o$" is an interstitial atom of hydrogen.

It is very important that during the irradiation of the crystal at temperature lower than 240 K there is no formation of the aggregate color centers; $O^{--}V_a^+$ are accumulated in a high quantity, since initially introduced during LiF crystal growing $O^{--}V_a^+$ dipoles are photo-thermostable under γ-irradiation at T<240 K, and, in addition to this, the ionizing treatment creates a high concentration of these dipoles as well as single ionized oxygen atoms and molecules due to a hydroxyl group dissociation. It is important to note that one of the products of $OH^-$ radiolysis—interstitial $H_i^o$ atoms are efficient traps of electrons $$H_i^o + e \Longrightarrow H_i^-, \tag{14}$$

which prevents the electrons from being captured by the $F_2^+$ center, thereby increasing the efficiency of accumulation of stable $F_2^{+**}$ centers on the following stages of the crystal preparation.

The role of Mg dopant is very important, too. According to the process (1) the F center formation is likely to occur near impurity-cation vacancy dipole $Mg^{++}$—$V_c^-$. The F center gives its electron to the divalent metal forming $Mg^+$ and a pair of vacancies $$Mg^{++}V_c^- + F \Longrightarrow Mg^+ + V_a^+V_c^-. \tag{15}$$

Anion-cation dipoles are important components of $F_2^+$ perturbed color centers that are formed at the second stage of the crystal preparation. At the same time superfluous concentration of Mg dopant may play a negative role due to decreasing concentration of the useful $O^{--}V_a^+$ dipoles by bonding with oxygen and formation of the $Mg^{++}O^{--}$ dipoles that do not take part in $F_2^+$ like center formation.

2nd stage

At the second stage of the technological process of the active medium preparation the crystals are heated up to T=250–270 K and stored in the refrigerator for a period of up to one month. During this time an important process of unperturbed $F_2^+$ color center formation takes place due to diffusion of mobile anion vacancies and their association with F centers $$V_a^+ + F \Longrightarrow F_2^+. \tag{16}$$

As a result the concentration of F centers is decreased due to their association with anion vacancies. It is a useful process helping to increase at the following stages the concentration of $F_2^+$ stabilized centers and decrease concentration of other aggregates and colloids. Note that the temperature interval 250–270 K is chosen within these borders since anion vacancies are mobile in the crystal and $F_2^+$ centers as well as $V_a^+V_c^-$ and $O^{--}V_a^+$ dipoles are frozen and cannot diffuse in the crystalline lattice.

3rd stage

At the third stage (which is not completely necessary) the crystals may be reirradiated at the temperature T<240 K with a dose of 25–250 C/kg and then subjected to the procedure described in the stage two. The main idea of this treatment is to increase the amount of pure $F_2^+$ centers by means of increasing the amount of anion vacancies (by the neutral F centers ionizing) that have been exhausted at the second stage due to process (16).

4th stage

At the fourth stage the crystals are heated up to room temperature and are stored for a period of some months, after which the crystals exhibit a stable concentration of the color centers of interest and is ready for utilization as active medium for the tunable laser. The processes that take place at this stage are as follows.

At room temperature the $O^{--}V_a^+$ complexes are mobile and their migration leads to the development of $F_2^{+**}$ centers stabilized with the $O^{--}$ ion ($F_2^+O^{--}$)

$$O^{--}V_a^+ + F \Longrightarrow F_2^+O^{--}. \tag{17}$$

Another very important reaction occurs due to the intrinsic mobility of $F_2^+$ centers at room temperature. The migration of these centers may lead to a useful process of association of $F_2^+$ centers with single ionized oxygen atoms $O^-$ with $F_2^+O^{--}$ centers formation $$F_2^+ + O^- + e \Longrightarrow F_2^+O^{--}. \tag{18}$$

Since at room temperature bivacancy dipoles $V_a^+V_c^-$ are mobile too ($V_a^+V_c^-$ start to be mobile at temperature about 273 K) they may associate with F centers and perturbed $F_2^+$ centers occur:

$$V_a^+V_c^- + F \Longrightarrow F_2^+V_c^-. \tag{19}$$

As a result of the described LiF crystal multistage treatment we provided the optimal conditions for useful processes (17–19) of $F_2^+$ stabilized color center formation and suppressed the efficiency of the parasitic processes (4–10) responsible for another aggregate as well as colloid center formation.

After the above-mentioned multistage treatments the LiF crystal with $F_2^+$ stabilized color centers was investigated at room temperature and its absorption, luminescence, lasing and operational properties were studied.

b) Method of lasing and why the problem of photostability is solved

As has been discussed in the description of the prior art the formation of the thermostabilized active color centers is only 50% of the success for stable output lasing of the color center laser. In addition to solving the problem of thermostability it is necessary to realize photostability of the active color center as well as other color centers that may be ionized by the powerful pump laser excitation.

In our particular situation of LiF color center crystal in addition to $F_2^{+**}$ color centers the LiF crystal contains a significant concentration of neutral $F_2$ centers. Investigations performed have demonstrated that photodestruction of $F_2$ centers by the radiation overlapping with its absorption band occurs via a two-step ionization process. The free electron passes through the conduction band and is finally localized on other aggregate color centers (see process 8).

The proposed method for photo-thermostable lasing of LiF: $F_2^{+**}$ color center crystals consists of three important components.

1) First, the technology of active medium formation should provide the highest possible concentration of the working optical centers. In this case the pump radiation will be predominantly absorbed by the photostable $F_2^+$ like centers.

2) Second, pump radiation from one hand should match the absorption band of $F_2^{+**}$ color centers to provide a population of inversion and lasing of these centers, and from another, should be longer than the threshold wavelength determining the process of two step ionization of the neutral $F_2$ centers. For the LiF crystals this wavelength is about 590 nm.

3) Finally, the wavelength of the pump radiation should not match the absorption bands of the parasitic aggregate color centers that may occur in the crystal and result in decreasing of the efficiency of lasing. For LiF crystal these parasitic color centers exhibit absorption in the region 500–600 nm. Taking into consideration the above-mentioned circumstances, the optimal spectral region for wavelength for LiF:$F_2^{+**}$ color center laser pumping is about 590–750 nm.

It should be particularly emphasized that one of the most important differences between the proposed stabilized LiF:$F_2^{+**}$ crystals and crystals known from the literature is the multistage irradiation and thermal treatment technology of specially doped LiF crystals. The proposed technology provides simultaneously the highest possible concentration of $F_2^+$ like centers in LiF at a small level of losses, efficient thermal stabilization of $F_2^+$ like centers, and significantly reduces the efficiency of formation of color centers—donors of electrons, which, in turn, dramatically improve the overall photostability of the crystal under powerful laser excitation.

c) Tunable Laser System

Figure 2:
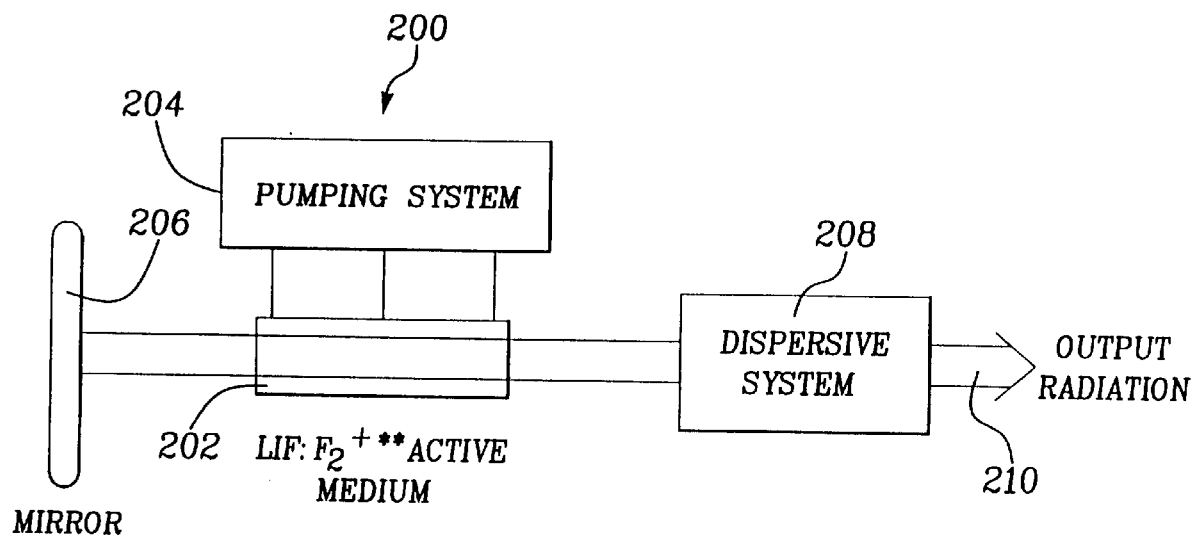
FIG. 2 is a block diagram of an embodiment of a tunable laser system according to the present invention.

FIG. 2 is a block diagram of tunable laser system 200 having LiF:$F_2^{+}$ crystal as active element 202 according to the present invention. The tunable laser system may include traditional components for tunable lasers such as: a pumping system 204, an active medium, rear mirror 206, and dispersive system 208. The dispersive system 208 may include a diffractive grating to provide narrowband frequency tuning of the laser output (by rotating the grating) across the broad amplification band of $F_2^{+}$ centers. The optical cavity, in which LiF crystal is placed may be similar to the conventional optical cavity for tunable laser systems having a tunable dye, color center, or transitional-metal doped active medium. The laser system 200 produces tunable output radiation 210.

The pumping system 204 provides radiation that longitudinally or transversially excites active medium 202. The pumping system may be a commercially available alexandrite laser, ruby laser, dye laser, Raman shifted second harmonic of neodymium laser, diode laser, or any possible light source (laser or flashlamp) emitting in the spectral range 590–750 nm. Tunable laser systems according to the present invention may be tuned using conventional techniques known to those of skill in the art.

The following experimental results shows the advantageous properties of the LiF:$F_2^{+**}$ crystals and their efficient, high output and stable lasing.

EXPERIMENTAL RESULTS a) Spectroscopic Properties

The crystals were grown by the Kyropulos method, in argon atmosphere, from nominally pure raw materials, and doped with LiOH (0.1 mole %), $Li_2O$ (0.05 mole %) and $MgF_2$ (0.05 mole %). In order to obtain a high concentration of $F_2^{+**}$ centers and a small concentration of colloids and parasitic aggregate color centers, the grown crystals were subjected to a following multi-step ionizing irradiation treatment:

1) Crystals were γ-irradiated with a dose of 5×10³ C/kg at a temperature of about 200 K ($H_2CO_3$ melting temperature)
2) Crystals were heated up to 268 K and stored in the refrigerator for a period of two weeks.
3) Crystals were γ-reirradiated at the temperature about 200 K with a dose of 50 C/kg and stored in the refrigerator for a period of two weeks.
4) Crystals were heated up to the room temperature and stored for a period of one month.

LiF:$F_2^{+}$ crystals produced as a result of the steps of FIG. 1, 102–114 feature a high concentration of the active $F_2^{+}$ centers at a low level of losses. Absorption measurements were made with Shimadzu 3401 spectrophotometer. Measured coefficient of absorption is about 2.3 cm⁻¹ @ 620 nm. The $F_2^{+**}$ concentration was determined by a well known Smakula's equation:

$$N_F = 0.87 \cdot 10^{17} \cdot \frac{n}{(n^2 + 2)^2} \cdot \frac{1}{f} \cdot \alpha(\text{cm}^{-1}) \cdot \Delta\nu(\text{eV}) \quad (20)$$

Figure 3:
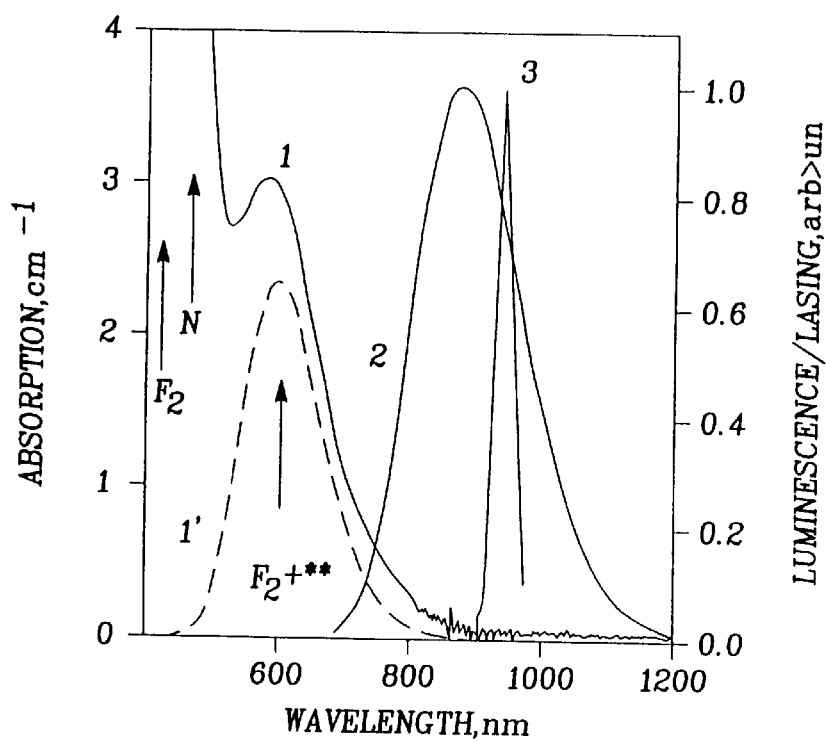
FIG. 3 illustrates absorption (1 and 1'), luminescence (2) and lasing (3) spectra (in non-selective resonator) for $F_2^{+**}$ color centers in LiF laser crystal at 300 K.

$\alpha = 2.3$ cm⁻¹     absorption coefficient
$\Delta\nu = 3577$ cm⁻¹ or 0.4435 eV     HWFM for absorption
$n = 1.39$     refractive index at 617 nm
$f = 0.1–0.2$     oscillator strength The results of spectroscopic evaluation of the laser crystals used are illustrated in FIG. 3. $F_2^{+}$ color centers feature quasi-homogeneously broadened absorption ($\lambda_{max}$~620 nm, $\Delta\upsilon$~3550 cm⁻¹) and luminescence ($\lambda_{max}$~890 nm, $\Delta\upsilon$~2300 cm⁻¹) bands, short luminescence lifetime (20 ns at 300 K and 37.5 ns at 77 K), high emission cross section ($\sigma_e$=5.7× 10⁻¹⁷ cm² at 890 nm), and a high quantum efficiency of fluorescence ~55% at 300 K. These LiF:$F_2^{+}$ crystals feature a high concentration of the active $F_2^{+**}$ centers (4–8×10¹⁶ cm⁻³) at a low level of losses (contrast ~40).

LiF:$F_2^{+}$ crystals used in experiments do not exhibit any photodegradation when pumped by radiation in 600–750 nm spectral region at energy densities of up to 5–10 J/cm² (this value is limited by optical damage of the crystal host). We estimated the lifetime of these color center crystals to exceed 10 years at room temperature. LiF:$F_2^{+}$ crystals are moisture resistant, mechanically durable, and easy to handle. Their solubility in water (0.1 g/100 g $H_2O$) is acceptable for practical applications in natural conditions. LiF exhibits high thermal conductivity coefficient α=14 W/m°C (at 300 K). This is even higher than the value of 13 W/m°C for YAG crystals. Therefore, LiF:$F_2^{+**}$ is a promising laser material for achieving high average power lasing at room temperature.

b) Laser Experiment

Initial laser experiments were performed in a simple flat-flat resonator, set to a length of about 20 cm. The active element, with Brewster faces, had 40 mm length and clear aperture of 8×8 mm. The input dichroic mirror transmitted ≧93% at 683 and 740 nm and reflected ≧99% in the 875–1040 nm range. An unfocused pumping beam was introduced into a crystal through this dichroic mirror. The output coupler transmitted about 50% in the 800–1100 nm range. Parameters of the pumping laser sources used in our experiments are as follows:

| Pumping laser | Wavelength, nm | Energy per pulse, mJ | Pulse width, ns | Repetition rate, Hz |
|---|---|---|---|---|
| Alexandrite laser PAL-101 (Light Age, Inc.) | 740 | up to 250 | ~60 | 20 |
| Raman shifted ($H_2$) SH of Nd:YAG laser GCR-230 (Spectra Physics, Inc.) | 683 | up to 250 | ~6 | 10 |

Figure 4:
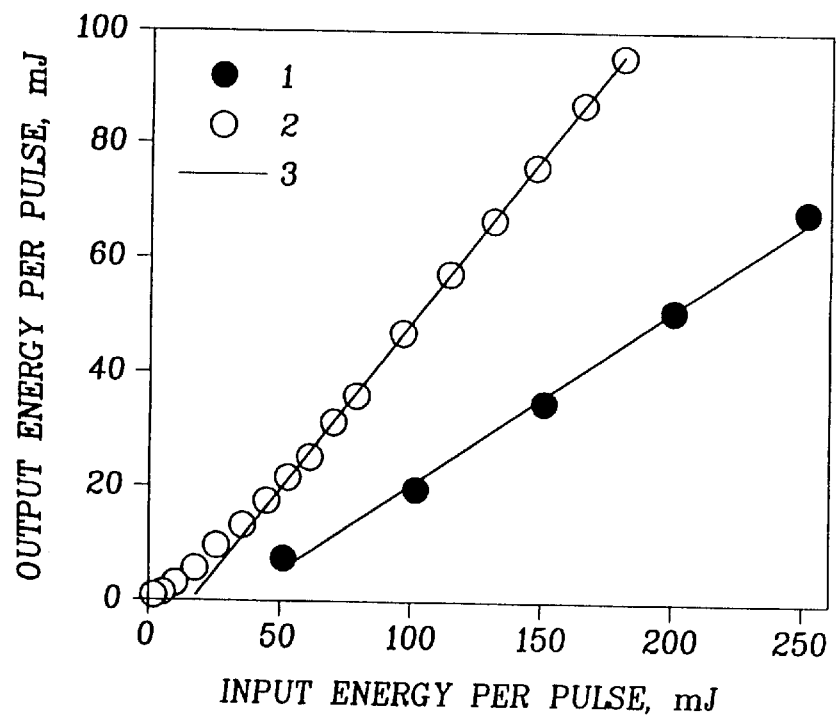
FIG. 4 illustrates an input/output dependence for LiF:$F_2^{+}$ laser at 300 K with nonselective resonator under pumping with: (1) $\lambda_{pump}$=683 nm, and (2) $\lambda_{pump}$=740 nm. Line (3) is linear fit.

Experimentally, it was determined that for alexandrite laser pumping, the optimum wavelength was ~740 nm. Because the alexandrite laser has the maximum output energy around 750 nm, with a sharp drop to 720 nm, the pumping wavelength of 740 nm is a compromise at which the output energy of the alexandrite laser is high enough and the absorption of $F_2^{+}$ centers is still sufficient for effective lasing. The lasing spectrum for the LiF:$F_2^{+}$ laser with a non-selective resonator under alexandrite laser pumping (740 nm) is shown in FIG. 3 (curve 3) with maximum at 950 nm and bandwidth of about 30–40 nm (FWHM). The input-output curve for this laser with a 50% output coupler is shown in FIG. 4 (curve 1) with slope efficiency of ~31%. The lasing threshold was estimated to be ~150 mJ/cm². A maximum output average power of 1.4 W was achieved with 5 W of input power at 740 nm incident onto the crystal (real efficiency ~28%). The same resonator arrangement was used for 683 nm pumping radiation, but the output coupler had 10% reflectivity. A much higher slope efficiency of 58% and real conversion efficiency of ~53% were obtained (see FIG. 4, curve 2). The efficiency was higher than for alexandrite laser pumping because (1) the 683 nm wavelength is closer to the absorption peak (620 nm) of $F_2^{+**}$ centers ($k_{683\ nm}/k_{740\ nm}$=2.9), and (2) temporal relationship between the laser pulsewidth and luminescence decay time ($\tau_{lum}$=20 ns) is different: $t_{pulse}$=6 ns<$\tau_{lum}$ for the 683 nm pumping and $t_{pulse}$=60 ns>$\tau_{lum}$ for alexandrite laser. The lasing threshold of 7–8 mJ/cm² under 683 nm pumping was also lower (even with 10% reflectivity of output coupler).

The maximum output power of the LiF:$F_2^{+**}$ laser was limited by the available capabilities of the pumping lasers used.

Figure 5:
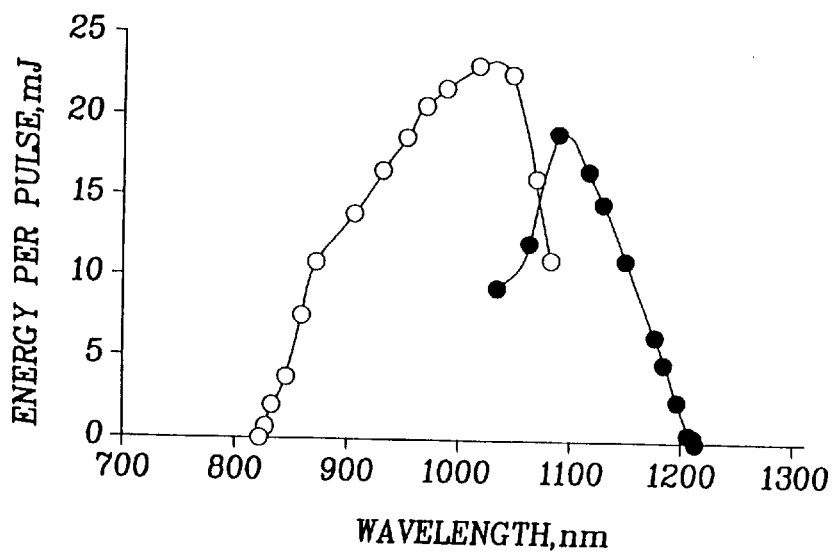
FIG. 5 illustrates tuning curve for LiF:$F_2^{+}$ laser (300 K, $\lambda_{pump}$=740 nm, $E_{pulse}$~120 mJ, $t_{pulse}$~50 ns), $E_{pulse}$ is the energy per pulse for radiation incident on the crystal.

In order to measure the tuning range, the output coupler was replaced with a diffraction grating with 1200 grooves/mm. The experimental tuning curve extended from 820 to 1120 nm and is shown in FIG. 5. By replacing the input dichroic mirror (optimal for 875–1040 nm range) with a mirror which had high reflectivity in 1000–1200 nm and low reflectivity in 800–1000 nm ranges the tuning range was extended up to 1200 nm.

In addition to immediate application, as a source of the tunable radiation in the IR 800–1200 nm spectral region the described color center laser can be of great interest of course in the UV-visible 200–600 nm spectral region. This spectral region can be easily obtained by a standard frequency doubling, tripling and quadrupling of the tunable IR radiation. Moreover, parametric frequency mixing—realization of the frequency difference in a nonlinear crystal (for example $AgGaS_2$, $AgGaSe_2$, $HgGaS_4$, and GaSe) between the pump radiation and tunable radiation of the color center laser will extend the tuning range in the middle and far infrared region of the optical spectrum from 2 to 20 μm continuously.

What is claimed is:

1. A method for fabricating a LiF:$F_2^{+**}$ active medium, comprising:

producing a LiF crystal having OH⁻, O⁻⁻ and divalent metal impurities; and processing said LiF crystal to create $F_2^{+**}$ color centers in concentrations of about $10^{-8}$ to $10^{-5}$ atomic percent.

2. The method of claim 1 wherein said producing step further comprises growing of LiF crystal from a melt doped with LiOH, $Li_2O$, and $MgF_2$ impurities.

3. The method of claim 1 wherein said processing step further comprises polishing said LiF crystal;

irradiating said LiF crystal with ionizing irradiation at a dose of $2.5 \times 10^3$–$1.5 \times 10^4$ C/kg at a temperature corresponding to the start of anion vacancy ($V_a^+$) mobility in LiF crystal, said temperature comprising less than 240 K;

heating said LiF crystal up to the temperature higher than characteristic temperature of anion vacancy mobility, and lower than characteristic temperature of $F_2^+$ centers as well as $V_a^+V_c^-$ and $O^{--}V_a^+$ dipole mobility in LiF, said temperature comprising 250–270 K, and storing said crystal in the refrigerator at this temperature for a period of up to one month;

reirradiating said LiF crystal at a temperature of less than 240 K with a dose of 0–250 C/kg and storing said crystal in the refrigerator at the temperature 250–270 K for a period of up to one month;

heating said LiF crystal up to the temperature higher than characteristic temperature of $F_2^+$ centers as well as $V_a^+V_c^-$ and $O^{--}V_a^+$ dipole mobility in LiF, said temperature comprising 273 K and above, and storing said crystal at this temperature for a period up to some months.

* * * * *